United States Patent
Economikos et al.

(10) Patent No.: US 6,294,470 B1
(45) Date of Patent: Sep. 25, 2001

(54) SLURRY-LESS CHEMICAL-MECHANICAL POLISHING

(75) Inventors: Laertis Economikos; Alexander Simpson, both of Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,922

(22) Filed: Dec. 22, 1999

(51) Int. Cl.[7] .................................................. H01L 21/302
(52) U.S. Cl. .......................... 438/692; 438/693; 252/79.1
(58) Field of Search ...................................... 438/691, 692, 438/693; 252/79.1–79.5

(56) References Cited

U.S. PATENT DOCUMENTS

| | | | |
|---|---|---|---|
| 5,300,463 | * 4/1994 | Cathy et al. ........................... | 437/228 |
| 5,352,277 | 10/1994 | Sasaki ...................................... | 106/6 |
| 5,607,718 | 3/1997 | Sasaki et al. ........................... | 427/97 |
| 5,725,417 | 3/1998 | Robinson ................................. | 451/56 |
| 5,733,176 | 3/1998 | Robinson et al. ...................... | 451/41 |
| 5,782,675 | 7/1998 | Southwick .............................. | 451/56 |
| 5,855,804 | 1/1999 | Walker .................................... | 216/89 |
| 5,876,490 | * 3/1999 | Ronay ...................................... | 106/3 |
| 5,897,424 | 4/1999 | Evans et al. ............................ | 451/41 |
| 5,897,426 | 4/1999 | Somekh .................................. | 451/41 |
| 5,914,275 | 6/1999 | Kodera et al. ......................... | 438/693 |
| 5,919,082 | 7/1999 | Walker et al. .......................... | 451/41 |
| 5,958,794 | 9/1999 | Bruxvoort et al. .................... | 438/692 |
| 5,968,280 | 10/1999 | Ronay ...................................... | 134/2 |
| 5,972,124 | 10/1999 | Sethuraman et al. .................. | 134/7 |
| 5,972,792 | 10/1999 | Hudson .................................. | 438/691 |
| 5,981,454 | 11/1999 | Small ...................................... | 510/175 |
| 6,132,637 | * 10/2000 | Hosali et al. ........................... | 252/79.1 |
| 6,171,352 | * 1/2001 | Lee et al. ................................ | 51/307 |

* cited by examiner

Primary Examiner—Benjamin L. Utech
Assistant Examiner—Kin-Chan Chen
(74) Attorney, Agent, or Firm—Steven Capella

(57) ABSTRACT

The invention provides slurry-less chemical-mechanical polishing processes which are effective in planarizing oxide materials, especially siliceous oxides, even where the starting oxide layer has significant topographical variation. The processes of the invention are preferably characterized by the use of a fixed abrasive polishing element and by use of an aqueous liquid medium containing a polyelectrolyte for at least a portion of the polishing process involving reduction in the amount of topographic variation (height differential) across the oxide material on the substrate. The method reduces or eliminates the transfer of topographic variations to levels below the desired planarization level. The processes enable elimination of special endpoint detection techniques. The processes are also especially suitable for polishing interlevel dielectrics.

17 Claims, 3 Drawing Sheets

SLURRY-LESS CHEMICAL-MECHANICAL POLISHING

BACKGROUND OF THE INVENTION

While a variety of materials configurations exist in integrate circuit structures, a common element for many integrated circuit structures is the dielectric-filled isolation trench. Isolation trenches are widely used to allow the compact arrangement of electrically active components making up the integrated circuit(s) without adverse effects on electrical operability.

When isolation trench structures are formed in a substrate (e.g., by etching), variation in trench depth often occurs between the various trenches formed on the same substrate level on different parts of the wafer. Typically, the variation may be on the order of about 10% of the intended trench depth. To ensure that all the trenches (across the entire wafer) are completely filled with dielectric isolation material, it is typically necessary to deposit sufficient dielectric material to account for the non-uniformity of trench depth.

The necessity to account for variation in trench depth results in an overfill of the shallower trenches and a fairly thick deposit over the wafer surface. Additionally, the dielectric material (typically an oxide) deposited to fill the trenches is typically conformal to some extent. Thus, the local step topography (step height) of the trenches is reflected at least to some extent in the upper surface of the dielectric deposited to fill the trenches. Large step height is normally encountered in combination with a high "within" wafer (overfill) thickness. The deeper (or more narrow the aspect ratio) the trench to be filled, the greater the step height in the dielectric filling layer and the more overfill is required to ensure complete filling of the trench structures across the wafer.

Another use of dielectric oxides, such as silicon oxides formed by reacting tetraethylorthosilicate (TEOS) and oxygen or ozone, is for so-called interlevel dielectric (ILD), e.g., between metal interconnects of aluminum/copper or tungsten typically for back end of the line (BEOL) wiring. A general discussion of interlevel dielectrics can be found in "Fundamentals of Semiconductor Processing Technology" by El-Kareh, Kluwer Academic Publishers, (1995), pages 565–571, which discussion is incorporated herein by reference. Silicon oxide layers and other insulators obtained by other processes may also be used as interlevel dielectrics. For example, other widely used materials for such purposes are boron and/or phosphorous doped silicate glasses.

In a formation of a conventional ILD oxide structure, a first layer of interlevel dielectric such as silicon oxide may be deposited on a surface having raised metal features (e.g., metal lines) by chemical vapor deposition (CVD) with the silicon oxide filling the gaps between the metal lines. This CVD step typically results in the formation of undesired voids between in the deposited oxide between the metal features. The silicon oxide over the horizontal (top) surfaces of the metal lines may then be removed by an anisotropic etch (e.g., sputter etching) to open the voids. The structure at this point typically has silicon oxide left in spaces between lines and as spacers on the sidewalls of the metal lines. A second layer of an insulator such as silicon oxide can then be deposited to fill the voids and complete the interlevel dielectric structure between different metallic layers.

Chemical-mechanical polishing (CMP) to remove dielectric materials has been widely used to improve the quality and manufacturability of integrated circuit device structures. Generally, the objective in polishing is to remove the deposited dielectric material across the wafer so it remains only within the trenches (or between conductive features, e.g., metal lines) and presents a planar surface for subsequent processing.

Often, a reactive ion etching process (to reduce step height and/or overall thickness in the deposited dielectric material) is required in combination with a conventional slurry chemical-mechanical polishing (CMP) process in order to obtain proper planarization. Reactive ion etch processes are not desirable from the point of cost and/or process control.

Conventional slurry-less CMP (alkaline medium—pH= 11—using a fixed abrasive) is generally selective to step height (i.e., capable of reducing step height differential), but where the step height differential is substantial, slurry-less CMP is not capable of performing the necessary material removal without over polishing which results in a non-planar final surface. This deficiency limits use of slurry-less CMP processes to structures with small (e.g., less than 200 Å) variation in trench depth or oxide overfill.

Often in these various CMP processes, the need to stop on the underlayer (without overpolishing) may lead to the use of elaborate polishing endpoint detection techniques to avoid overpolishing. This concern is especially present for interlevel dielectrics where overpolishing may erode the metal or dish the fill oxide or compromise adjacent or underlying metal features. Concern regarding overpolishing may also lead to use of processes having slow polishing rates which result in increased process time.

Thus, there is a need for improve polishing processes which are capable of removing material at large step height differential to produce a substantially planar surface while avoiding the need for RIE etch back processing or other undesirable alternatives. There is also a need for improved polishing processes that enable more control against overpolishing.

SUMMARY OF THE INVENTION

The invention provides slurry-less chemical-mechanical polishing processes which are effective in planarizing oxide materials, especially siliceous oxides, even where the starting oxide layer has significant topographical variation (e.g., step height differential). The processes of the invention are preferably characterized by the use of a fixed abrasive polishing element and by use of an aqueous liquid medium containing a polyelectrolyte for at least a portion of the polishing process involving reduction in the amount of topographic variation (height differential) across the oxide material on the substrate.

In one aspect, the invention encompasses a method of polishing an oxide material layer on a substrate by slurry-less chemical-mechanical polishing, the method comprising:
 a) providing a substrate having an oxide material layer on a first surface, the oxide material layer having portions which have a height differential relative to each other, the height being measured from a reference plane parallel with a principal plane of the substrate,
 b) providing an aqueous liquid medium containing a polyelectrolyte,
 c) contacting the oxide material layer of the substrate with the aqueous liquid medium and with a polishing member, the polishing member containing a fixed abrasive component therein, and
 d) maintaining the contact of step c) while providing movement between the substrate and polishing member, whereby the height differential becomes reduced.

The oxide material to be polished is preferably a dielectric material, more preferably silica or boron phosphosilicate glass (BPSG). The polyelectrolyte is preferably a polyacrylic acid. Preferably, step d) is conducted until an underlayer is revealed to a desired extent. The aqueous medium is preferably alkaline.

In another aspect, the invention encompasses a method for removing exposed interlevel dielectric oxide from a substrate, the method comprising a) providing a substrate having at least one feature selected from the group consisting of (i) a metal or conductive metal-containing structure contacting an exposed oxide layer, and (ii) a metal or conductive metal-containing structure having an exposed surface in an exposed oxide material layer, b) providing an aqueous liquid medium containing a polyelectrolyte, c) contacting the oxide material layer of the substrate with the aqueous liquid medium and with a polishing member, the polishing member containing a fixed abrasive component therein, and d) maintaining the contact of step c) while providing movement between the substrate and polishing member, whereby oxide material is removed.

In a further aspect, the invention encompasses the conducting of the slurry-less processes of the invention to a desired planarize endpoint without the use of a special endpoint detection technique. These and other aspects of the invention are described in further detail below.

DETAILED DESCRIPTION OF THE INVENTION

Figure 1:
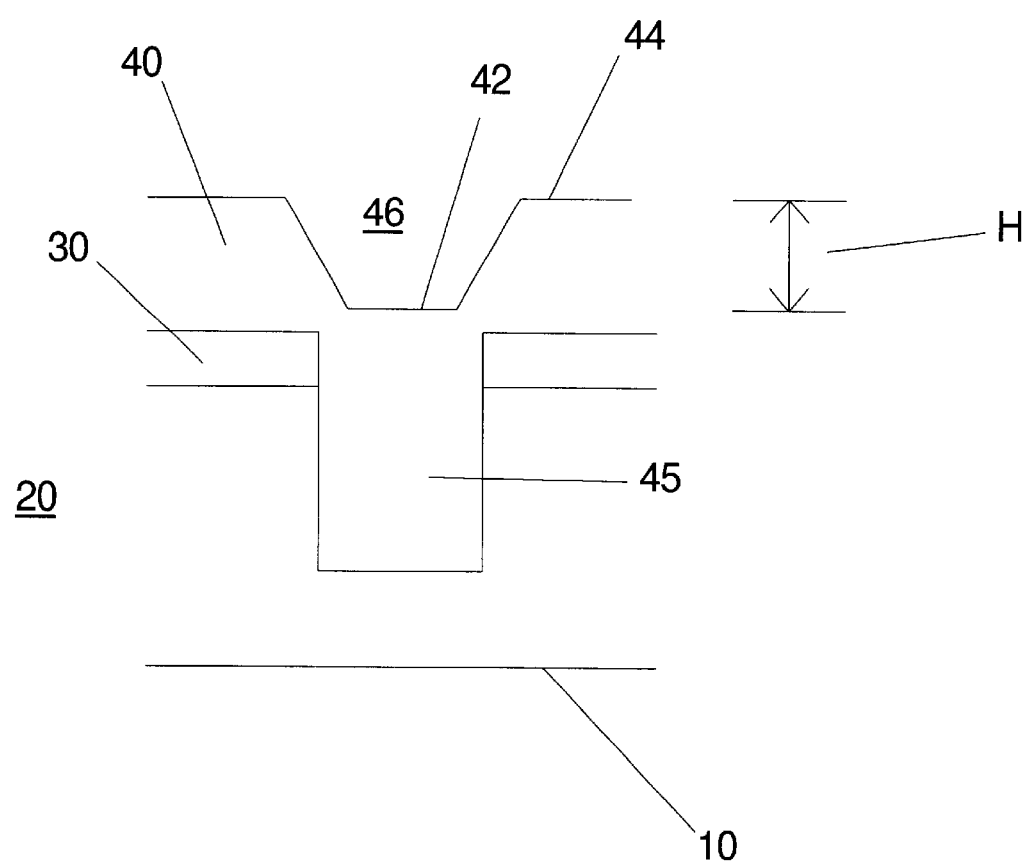
FIG. 1 shows a schematic cross section of a dielectric isolation layer to be planarized on a substrate, the layer having a height differential between portions.

The invention provides slurry-less chemical-mechanical polishing processes which are effective in planarizing oxide materials even where the starting oxide material layer has significant topographical variation. The processes of the invention are preferably characterized by the use of a fixed abrasive polishing element and by use of an aqueous liquid medium containing a polyelectrolyte for at least a portion of the polishing process involving reduction in the amount of any topographic variation (height differential) which may exist in the oxide material on the substrate.

In one aspect, the invention encompasses a method of polishing an oxide material layer on a substrate by slurry-less chemical-mechanical polishing, the method comprising:

a) providing a substrate having an oxide material layer on a first surface, the oxide material layer having portions which have a height differential relative to each other, the height being measured from a reference plane parallel with a principal plane of the substrate, b) providing an aqueous liquid medium containing a polyelectrolyte, c) contacting the oxide material layer of the substrate with the aqueous liquid medium and with a polishing member, the polishing member containing a fixed abrasive component therein, and d) maintaining the contact of step c) while providing movement between the substrate and polishing member, whereby the height differential becomes reduced.

In another aspect, the invention encompasses a method for removing exposed interlevel dielectric oxide from a substrate, the method comprising a) providing a substrate having at least one feature selected from the group consisting of (i) a metal or conductive metal-containing structure contacting an exposed oxide layer, and (ii) a metal or conductive metal-containing structure having an exposed surface in an exposed oxide material layer, b) providing an aqueous liquid medium containing a polyelectrolyte, c) contacting the oxide material layer of the substrate with the aqueous liquid medium and with a polishing member, the polishing member containing a fixed abrasive component therein, and d) maintaining the contact of step c) while providing movement between the substrate and polishing member, whereby oxide material is removed.

If desired, other polishing steps may be employed in addition to the process of steps a)–d) above, however, the method step d) is preferably conducted until the oxide layer becomes reduced to a desired thickness and/or until a stop material (underlayer or metal feature) is exposed to a desired extent.

The processes of the invention are otherwise not limited to use of any specific slurry-less CMP set up or apparatus. Examples of fixed other apparatus are disclosed in U.S. Pat. Nos. 5,958,794; 5,855,804; 5,972,124; 5,897,426; 5,733,176; 5,919,082; 5,972,792; or 5,782,675, the disclosures of which are incorporated herein by reference.

The processes of the invention may be used to polish various oxide materials on various substrates, however the processes of the invention are especially useful in the context of oxide dielectric materials and substrates used in the production of integrated circuit devices and/or other microlithographically created articles. The materials to be polished are preferably oxide dielectric materials to be configured or removed in the production of such devices or articles. The processes of the invention are especially useful for the planarization or removal of siliceous oxide materials, more especially silicon dioxide materials. The processes of the invention may also be used with other siliceous materials such as doped silicon dioxide films (e.g., BPSG, BSG, etc.). For interlevel dielectric oxides, the oxide is preferably a silicon oxide (e.g., $SiO_2$) and/or a silicate containing one or more elements selected from groups 3A (e.g. boron) and 5A (e.g. phosphorus or arsenic). The interlevel dielectric may be adjacent to metal or metal-containing features formed from various materials such as copper, copper alloy, titanium, titanium nitride, tantalum, tantalum nitride, aluminum and/or aluminum alloy.

The oxide material to be polished may be present without significant topography or may be relatively planar, however, the processes of the invention are especially useful where the initial dielectric oxide layer is non-planar at least in part because it is located over a surface already having at least one location of height differential. An example of such a structure is shown in FIG. 1. The substrate 20 has a first layer 30 (e.g., a silicon nitride stop layer) and a trench 45 (e.g., a trench to be filled with an oxide dielectric isolation material). The oxide material layer 40 overfills trench 45 and oxide layer 40 has a depression 46 therein. The height differential H is the distance between top surface 44 and depression surface 42 measured relative to a reference plane 10. The processes of the invention are especially useful for planarizing layers having height differentials of about 2000 Å or more, especially about 4000 Å or more. A typical height differential of interest will be on the order of about 4000 to 7000 Å.

Oxide material 40 may be provided by various known techniques such as spin-on-glass (SOG) coating, chemical vapor deposition (CVD), physical vapor deposition, high density plasma or other technique. See for example, the various techniques discussed in "Fundamentals of Semiconductor Processing Technologies", by Badih El-Kareh, Kluwer Academic Publishing, 1995 or other texts. Typically, deposition or formation of the dielectric oxide layer 40 over a surface having topography results in topographic variation in the oxide layer 40. In some instances, topographic variation may occur in oxide layer 40 even where the structure underlayer 30 contains no topographic variation (not shown), for example, if the formation of oxide layer 40 is preferential over certain areas of layer 30 (e.g., due to variation of material composition in regions of layer 30 and/or due to the nature of the specific dielectric layer formation step itself). Topographic variation may also occur in oxide layer 40 where the structure underlayer 30 contains a topographic variation within a die and across the wafer. This variation may be attributed to variations in trench 45 depth and width. Layer 40 may contain one or more such regions having a height differential, e.g., where a plurality of trenches 45 are to be filled.

The aqueous liquid medium is characterized by the presence of a polyelectrolyte. The liquid medium preferably contains at least about 0.01 wt. % of polyelectrolyte, more preferably about 0.05–1.0 wt. %, most preferably about 0.1–0.5 wt. %. The polyelectrolyte is preferably selected from the group consisting of polyacrylic acid, polyethyleneimine, polymethylmethacrylate, polymethacrylic acid, polymaleic acid, or mixtures thereof. More preferably, the polyelectrolyte is polyacrylic acid. The polyelectrolyte preferably has a weight average molecular weight of about 500–20000, more preferably about 500–11000. Other polyelectrolytes, such as those described in U.S. Pat. No. 5,968,280, the disclosure of which is incorporated herein by reference, may also be used.

The aqueous liquid medium preferably has a pH of about 4–13, more preferably about 9–13, most preferably about 10–12. Any suitable base may be used for establishing the pH level of the solution at an alkaline level, however, hydroxides such as ammonium hydroxide are preferred. The liquid medium may contain other components known in the art, however the liquid medium preferably consists essentially of water, base and polyelectrolyte.

Figure 2:
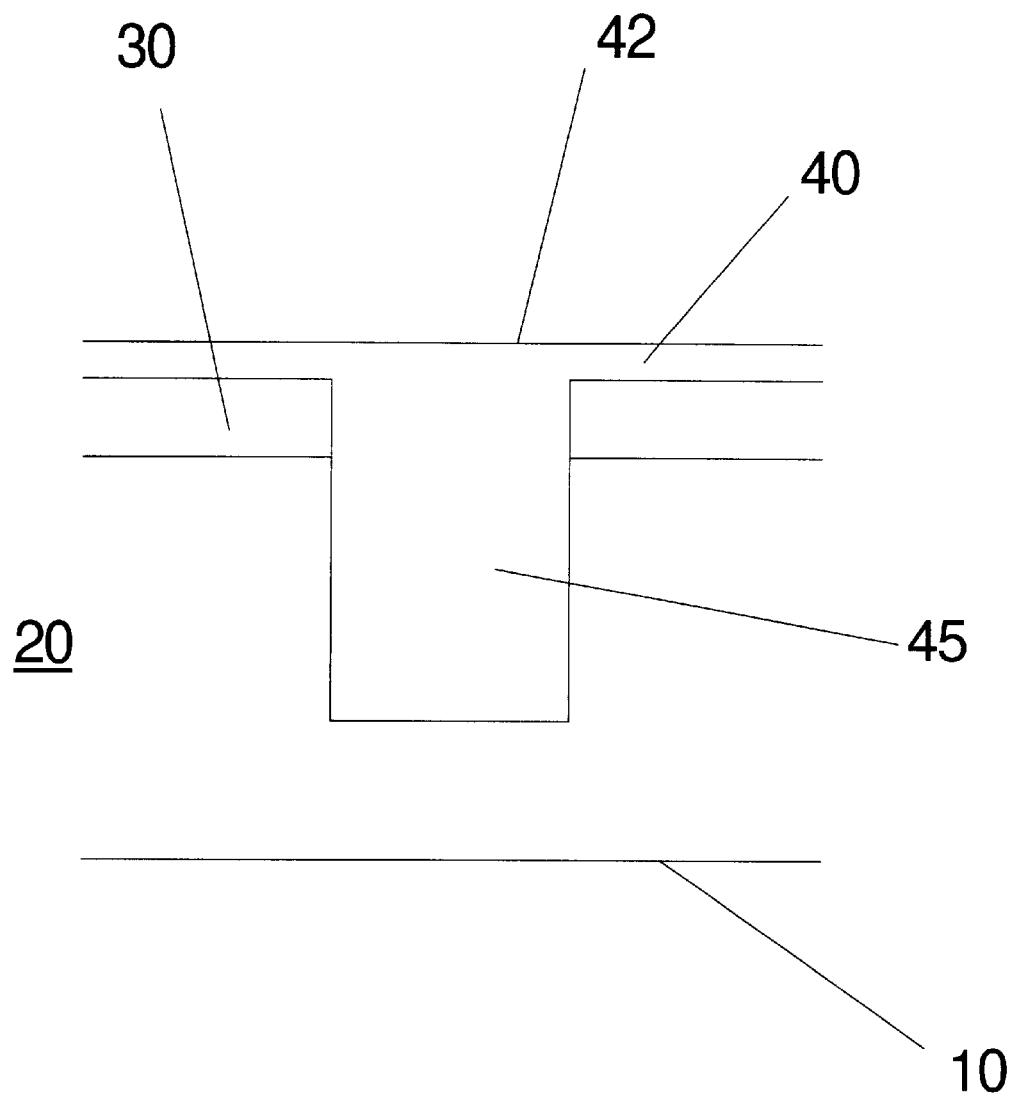
FIG. 2 shows a schematic cross section of a dielectric isolation layer of FIG. 1 after leveling off of the height differential.
Figure 3:
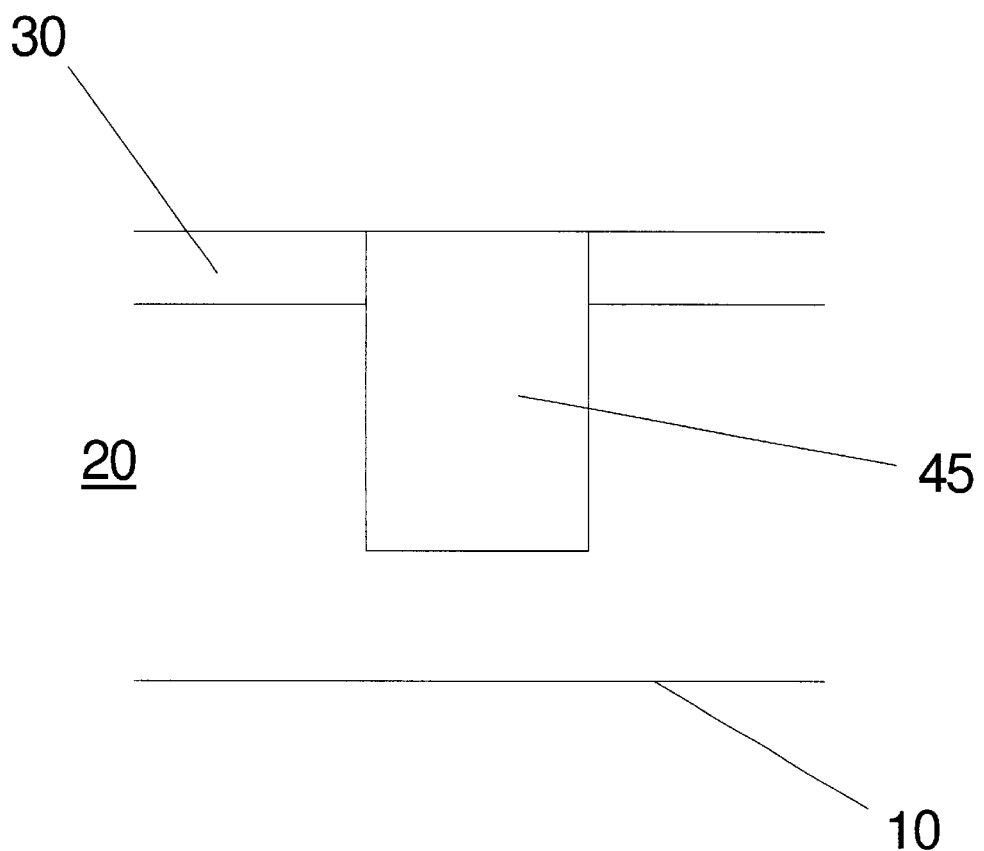
FIG. 3 shows a schematic cross section of a dielectric isolation layer of FIG. 2 after further reduction in height to reveal a stop layer.

If desired, a conventional slurry-less CMP process or other process may be implemented when the height differential H has been sufficiently reduced by process step d). Preferably, step d) is continued at least until the step height differential is reduced to about 200 Å or less for all portions of oxide layer 40, at least until height differential H is substantially eliminated (e.g., as shown in FIG. 2). Most preferably, polishing step d) is carried out until a desired reduction in thickness is achieved in oxide layer 40 or more preferably until a stop layer 30 is exposed (e.g., as shown in FIG. 3). That is, the process of the invention enables the polishing from substantial step height differential through desired exposure of an underlayer (e.g., a stop layer) while achieving substantial planarization (i.e., without substantial topographic variation once the underlayer is desirably exposed).

The methods of the invention are especially advantageous for obtaining planarization while stopping effectively on the underlayer. Where the underlayer is designed to act as a stop layer, the invention may enable reduction in the thickness of that stop layer because of the increased ability of the methods of the invention to stop with high precision (i.e., without polishing through the stop layer). The invention also enables precise stopping of the polishing process without compromise of the polishing rate and without need for any special endpoint detection technique.

What is claimed is:

1. A method of polishing an oxide topographic feature on a substrate by slurry-less chemical-mechanical polishing, said method comprising:

a) providing a substrate having an oxide material layer on a first surface, the oxide material layer having portions which have a height differential relative to each other, the height being measured from a reference plane parallel with a principal plane of the substrate, b) providing an aqueous liquid medium containing a polyelectrolyte, c) contacting the oxide material layer of the substrate with the aqueous liquid medium and with a polishing member, the polishing member containing a fixed abrasive component therein, and d) maintaining the contact of step c) while providing movement between the substrate and polishing member, whereby the height differential becomes reduced.

2. The method of claim 1 wherein said oxide layer contains at least one topographically non-uniform feature having a height differential of at least about 2000 Å.

3. The method of claim 2 wherein said feature has a height differential of at least about 4000 Å.

4. The method of claim 2 wherein said substrate contains a plurality of said topographic oxide features.

5. The method of claim 1 wherein said oxide is a siliceous oxide.

6. The method of claim 1 wherein said liquid medium contains at least about 0.01 wt. % of said polyelectrolyte.

7. The method of claim 6 wherein said liquid medium contains at least about 0.1 wt. % of said polyelectrolyte.

8. The method of claim 1 wherein said liquid medium contains about 0.1–0.5 wt. % of said polyelectrolyte.

9. The method of claim 1 wherein said liquid medium is alkaline.

10. The method of claim 9 wherein said liquid medium has a pH of about 9–13.

11. The method of claim 1 wherein said liquid medium has a pH of about 4–13.

12. The method of claim 1 wherein said polyelectrolyte is selected from the group consisting of polyacrylic acid, polyethyleneimine, polymethylmethacrylate, polymethacrylic acid, polymaleic acid, or mixtures thereof.

13. The method of claim 1 wherein said polyelectrolyte has a weight average molecular weight of about 500–20000.

14. The method of claim 1 wherein said polishing member used in steps c) comprises a particulate abrasive material fixed in a binder medium.

15. The method of claim 1 wherein said polishing is conducted in step d) until at least a portion of an underlying material layer on said substrate is exposed.

16. The method of claim 15 wherein said underlying layer comprises a nitride material.

17. A method for removing exposed interlevel dielectric oxide from a substrate, the method comprising
- a) providing a substrate having at least one feature selected from the group consisting of (i) a metal or conductive metal-containing structure contacting an exposed oxide layer, and (ii) a metal or conductive metal-containing structure having an exposed surface in an exposed oxide material layer,
- b) providing an aqueous liquid medium containing a polyelectrolyte,
- c) contacting the oxide material layer of the substrate with the aqueous liquid medium and with a polishing member, the polishing member containing a fixed abrasive component therein, and
- d) maintaining the contact of step c) while providing movement between the substrate and polishing member, whereby oxide material is removed.

* * * * *